United States Patent
Hosseini et al.

(10) Patent No.: US 12,158,625 B2
(45) Date of Patent: Dec. 3, 2024

(54) BIDIRECTIONAL OPTICAL GRATING COUPLER WITH MULTIPLE LIGHT PATHS FOR TESTING PHOTONICS DEVICES

(71) Applicant: Intel Corporation, Santa Clara, CA (US)

(72) Inventors: Kaveh Hosseini, San Jose, CA (US); Xiaoqian Li, Chandler, AZ (US); Conor O'Keeffe, Cork (IR); Jing Fang, Santa Clara, CA (US); Kevin P. Ma, Beaverton, OR (US); Shamsul Abedin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 771 days.

(21) Appl. No.: 17/132,967

(22) Filed: Dec. 23, 2020

(65) Prior Publication Data
US 2022/0196936 A1    Jun. 23, 2022

(51) Int. Cl.
*G02B 6/42*    (2006.01)
*H01L 21/66*    (2006.01)

(52) U.S. Cl.
CPC ............ *G02B 6/4214* (2013.01); *H01L 22/12* (2013.01)

(58) Field of Classification Search
CPC ........ G02B 6/4214; G02B 6/34; G02B 6/124; G02B 6/4204; G02B 6/4244; G02B 5/18; H01L 22/12; G01R 31/00; G01R 31/2601; G01M 11/02; G01M 11/31
See application file for complete search history.

(56) References Cited

U.S. PATENT DOCUMENTS

2018/0335566 A1   11/2018   Menezo
2020/0341191 A1*   10/2020   Meade .................. G01M 11/31

OTHER PUBLICATIONS

Search Report from European Patent Application No. 21209146.6, mailed Apr. 20, 2022, 11 pgs.
Office Action from European Patent Application No. 21209146.6, mailed Sep. 17, 2024, 7 pgs.

* cited by examiner

*Primary Examiner* — Michael P Mooney
(74) *Attorney, Agent, or Firm* — Schwabe, Williamson & Wyatt P.C.

(57) ABSTRACT

Embodiments described herein may be related to apparatuses, processes, and techniques related to a bidirectional optical grating coupler that may be used for testing. A photonic apparatus includes a first layer with electro-optical circuitry that is optically coupled with a bidirectional optical grating coupler. A second layer is physically coupled with a first side of the first layer and includes a first light path to optically coupled with the bidirectional optical grating coupler. A third layer is physically coupled with a second side of the first layer opposite the first side of the first layer, and includes a second light path that optically couples with the bidirectional grating coupler. Operational testing of the electro-optical circuitry is based in part on light received or transmitted through the second light path. Other embodiments may be described and/or claimed.

17 Claims, 7 Drawing Sheets

BIDIRECTIONAL OPTICAL GRATING COUPLER WITH MULTIPLE LIGHT PATHS FOR TESTING PHOTONICS DEVICES

GOVERNMENT LICENSE RIGHTS

This invention was made with Government support under Agreement No. HR0011-19-3-0003, awarded by DARPA. The Government has certain rights in the invention.

FIELD

Embodiments of the present disclosure generally relate to the field of photonics devices, and in particular to testing of photonics devices.

BACKGROUND

The use of photonic devices as part of packages in computers and computing devices are expected to continue to grow as demand for computing performance increases.

DETAILED DESCRIPTION

Embodiments described herein may be related to apparatuses, processes, and techniques related to photonic devices and wafer level testing of photonic devices prior to integration in a multichip package using a bidirectional optical grating coupler. Embodiments may include a photonic apparatus that includes a first layer that includes electro-optical circuitry, and a bidirectional optical grating coupler optically coupled with the electro-optical circuitry. In embodiments, the electro-optical circuitry may be optical circuitry or electrical circuitry. A second layer physically coupled with a first side of the first layer, the second layer including a first light path from the bidirectional optical grating coupler through the second layer, the bidirectional optical grating coupler to receive light or to transmit light via the first light path. A third layer physically coupled with a second side of the first layer opposite the first side of the first layer, the third layer including a second light path from the bidirectional grating coupler through the third layer, the bidirectional optical grating coupler to receive light or to transmit light via the second light path, where operational testing of the electro-optical circuitry is based in part on light received or transmitted through the first light path.

Embodiments described herein may be used to address wafer level testing of optical components, such as optical chiplets, before the optical components are integrated into a multichip package (MCP). In the absence of optical or electro-optical testing of a photonic apparatus, for example an optical die, it is difficult to identify whether an optical die passes quality control before it is integrated into the MCP. The inability to test prior to integration may cause a significant impact to the finished MCP yield. This results from the necessity of delaying testing of the optical die until after it is integrated into the MCP. Thus, manufacturing expense is increased.

In legacy implementations, wafer-level testing of the optical die is not practical due to purely downward (one-directional) grating couplers in the optical components. These downward grating couplers are designed in an optical chiplet to couple light only toward the substrate, as opposed to towards the metal layer. In legacy implementations, this allows topside fiber attaching when the die is in a flip chip configuration in the package. Because the optical direction of these legacy grating couplers is downward toward the substrate, it is not possible to couple light to the chiplet at a wafer-level testing station. Thus, in these legacy implementations, only electrical testing is possible, resulting in a test coverage gap for optical and electro-optical components within the wafer.

Embodiments described herein are directed towards a bidirectional optical grating coupler, which may be implemented as a standard grating coupler, that couples light in both an upwards and downwards direction. Thus, at the wafer level, it is possible to couple light to the die for testing including optical and/or electro-optical testing. After testing, a reflector or mirror layer may be applied to or embedded in the multi-chip package, for example, below the flip chip optical die, to block light going into the package substrate to minimize fiber to optical die coupling loss.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

The term "grating coupler" as is known in the art is a means to couple light from a photonics integrated circuit to a medium such as for example an optical fiber, free space or a lens.

As used herein, the term "bidirectional" when in the context of the bidirectional grating coupler refers to the input or output ports directions available within the grating coupler with reference to the cross-sectional plane of the grating coupler. A bidirectional grating coupler is one where light can be coupled in or out to either top or bottom of the planar structure.

As used herein, the term "photonics package" is a package containing at least one semi-conductor chiplet wherein the at least one or more of the chiplets contains at least one port capable of coupling an optical signal. Photonics package can be exclusively photonics input and/or output ports or a mix of electrical and photonics input and/or output ports.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Figure 1:
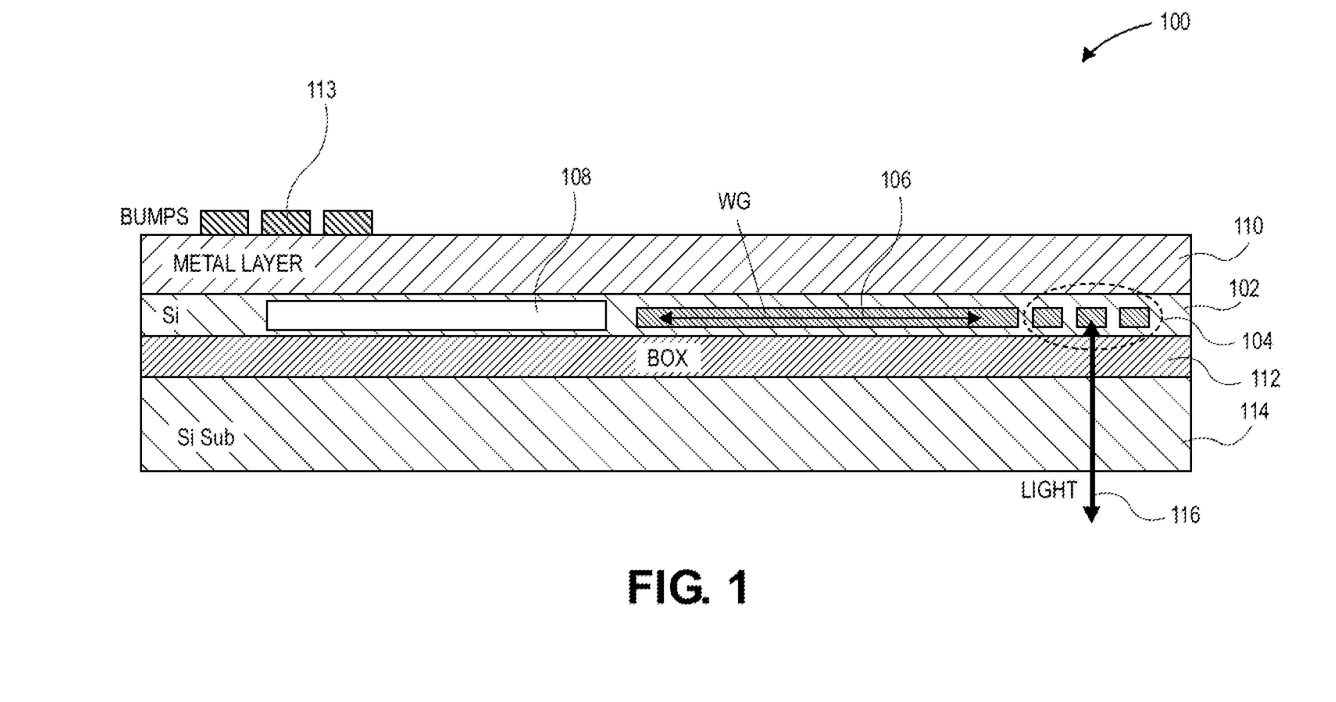
FIG. 1 illustrates an example cross-section of a photonics device with a legacy optical grating coupler in a downward direction.

FIG. 1 illustrates an example cross-section of a photonics device with a legacy optical grating coupler in a downward direction. Legacy photonics device 100 includes an optical layer 102 that may be made of silicon. The optical layer 102 includes a legacy grating coupler 104 that is optically coupled to a waveguide 106. The waveguide 106 is coupled to electro-optical circuitry 108. The optical and electro-optical circuitry 108 may include an optical transmitter, optical receiver, and/or other combination of electronics and optics components to generate, detect, measure, and/or convert signals from electrical to optical or from optical to electrical.

Electro-optical circuitry 108 may also be electrically coupled through metal layer 110 to electrical connectors 113. Electrical connectors 113 may also be referred to as electrical bumps, and will be electrically coupled with other components of the MCP during the flip chip process that is described in greater detail with respect to FIG. 5. The metal layer 110 may include redistribution layers (RDL) and/or other routing layers. In embodiments, these routings may include copper pillars (not shown) or vias (not shown) to route electric signals from the electro-optical circuitry 108 to the electrical connectors 113. In embodiments, there may be active and/or passive devices within the metal layer 110. Below the optical layer 102 is a buried oxide (BOX) layer 112 that is on top of the silicon substrate 114. The BOX layer 112 may be a silicon oxide ($SiO_2$) buried in the silicon substrate 114.

A light path 116 exists through the silicon substrate 114, through the BOX layer 112, and to the legacy grating coupler 104. The light path 116 may include a waveguide that conducts light, for example light from a fiber, as it is transmitted and/or received between the electro-optical circuitry 108, the waveguide 106, and the legacy grating coupler 104. The light path 116 may also include air. The legacy photonics package 100 does not allow for optical and electro-optical testing at the wafer level because light, in this design, cannot be coupled toward the metal layer 110. This leaves a significant gap in test coverage to determine proper operation of the optical components such as the waveguide 106 and grating coupler 104, and the electro-optical circuitry 108 prior to the MCP assembly.

Figure 2:
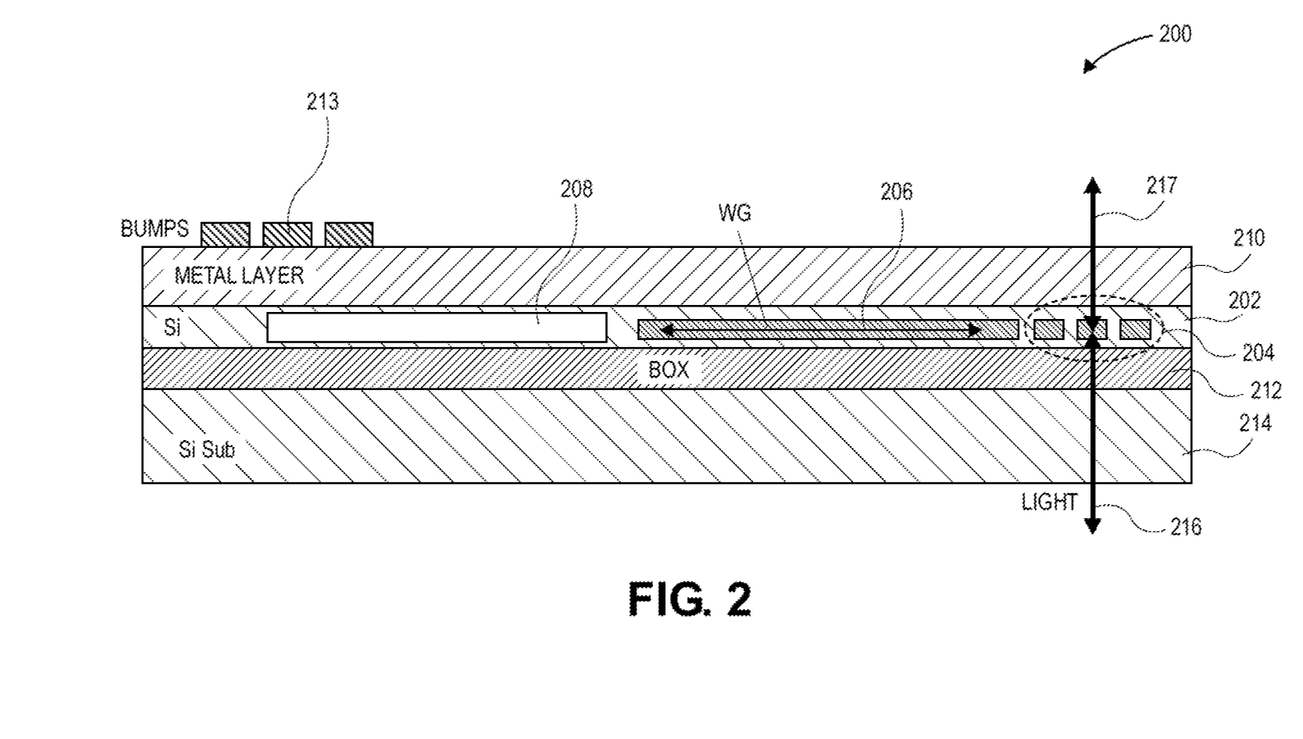
FIG. 2 illustrates an example cross-section of a photonics device with a bidirectional optical grating coupler, in accordance with embodiments.

FIG. 2 illustrates an example cross-section of a photonics device with a bidirectional optical grating coupler, in accordance with embodiments. Photonics device 200, which may be similar to photonics device 100 of FIG. 1, includes an optical layer 202, which may be similar to optical layer 102, that may be made of silicon. Optical layer 202 includes a bidirectional optical grating coupler 204 that is optically coupled to a waveguide 206, which may be similar to waveguide 106, that in turn is optically coupled to electro-optical circuitry 208, which may be similar to electro-optical circuitry 108.

The electro-optical circuitry 208 may also be electrically coupled through metal layer 210, which may be similar to metal layer 110 to electrical connectors 213, which may be similar to electrical connectors 113. Below optical layer 202 there may be a BOX layer 212, that may be similar to BOX layer 112, on top of a silicon substrate 214, which may be similar to silicon substrate 114.

A first light path 216, which may be similar to light path 116, exists through the silicon substrate 214, through the BOX layer 212, and to the bidirectional optical grating coupler 204. In embodiments, the first light path 216 will be used during production operation of the device to receive light from an external source for the purpose of either transmitting or receiving light signals. In addition a second light path 217 exists to allow light to pass from the bidirectional optical grating coupler 204 through the metal layer 210. The second light path 217 will allow wafer level testing of the photonics package because light can now be transmitted and/or received from the metal layer 210 side. In embodiments, test equipment may allow wafer level testing by electrically coupling with the electrical connectors 213, or electrical bumps 213, and optically coupling with the optical layer 202 via the second light path 217. Electrical bumps 213, will be electrically coupled with other components of the MCP during the flip chip process that is described in greater detail with respect to FIG. 5. In embodiments, the electrical bumps 213 may be applied to the metal layer 210 after electrical optical testing is performed.

The bidirectional optical grating coupler 204 is drastically different than the legacy grating coupler 104 of FIG. 1. As shown, the bidirectional optical grating coupler 204 allows both a first light path 216 and a second light path 217 both into and out of the optical device 200, and to allow signals carried on these light paths to interact with the electro-optical circuitry 208. In embodiments, there may be optical signal attenuation on the first light path 216 and the second light path 217 during operation. However, any signal attenuation will still allow data communication with the electro-optical circuitry 208 for the purposes of testing. In embodiments, during testing, there may be a temporary reflector (not shown) placed on an outside surface of the silicon substrate 214 covering a light path 216 to reflect back any light to the bidirectional coupler 204 during electro-optical testing using the second light path 217. After testing, the temporary reflector (not shown) would be removed.

Figure 3:
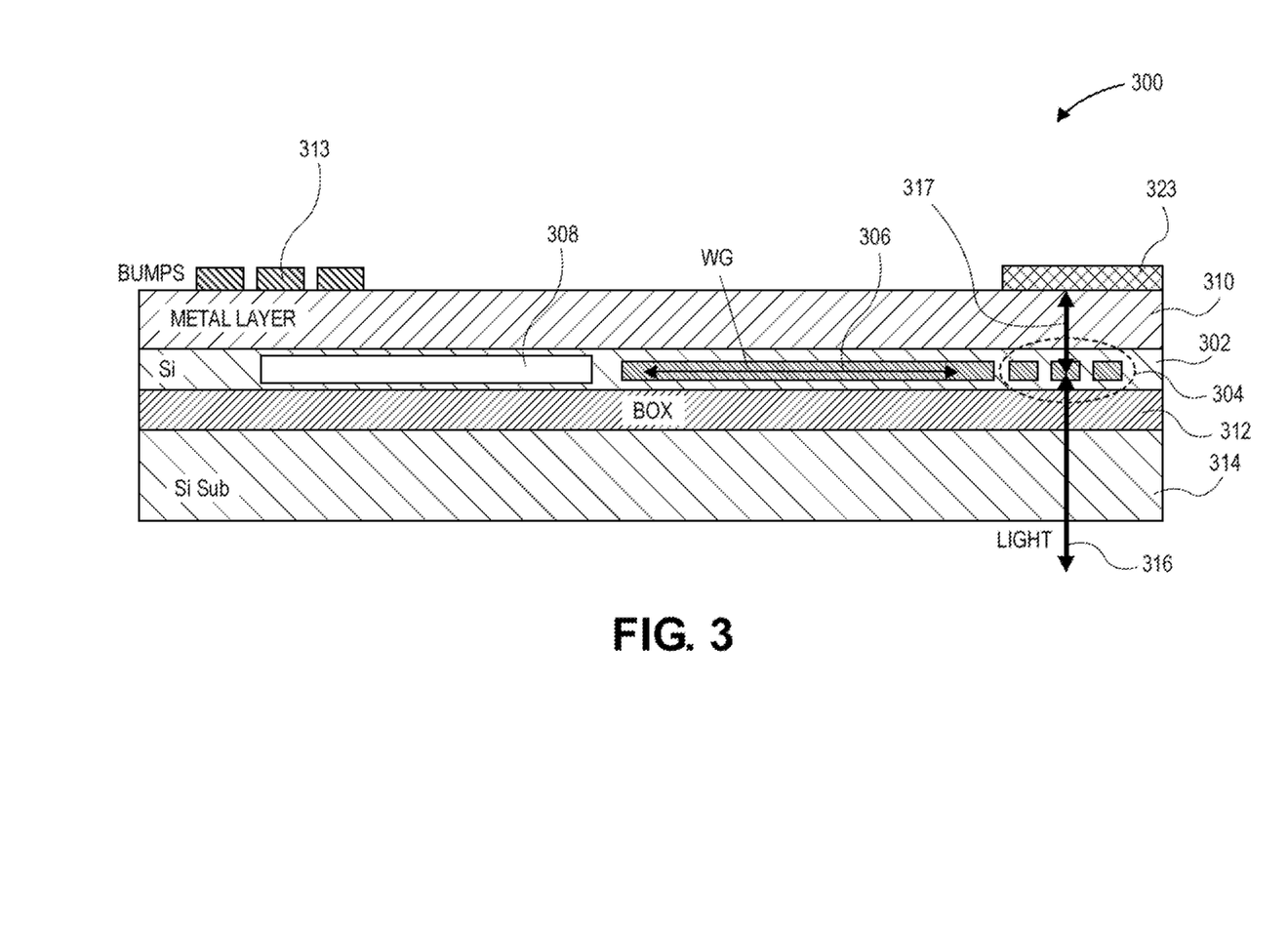
FIG. 3 illustrates an example cross-section of a photonics device with a bidirectional optical grating coupler, with a reflector on a layer of the photonics device, in accordance with embodiments.

FIG. 3 illustrates an example cross-section of a photonics device with a bidirectional optical grating coupler, with a reflector on a layer of the photonics device, in accordance with embodiments. Photonics device 300, which may be similar to photonics device 200 of FIG. 2, includes a reflector 323 that is placed on top of metal layer 310, which may be similar to metal layer 210 of FIG. 2. The reflector 323 is positioned to reflect light traveling down second path 317, which may be similar to second path 217 of FIG. 2 toward the reflector 323. In embodiments, the reflector 323 may be positioned within the metal layer 310, on top of the metal layer 310 (as shown), or in some other position to reflect light traveling down the second path 317.

In embodiments, the reflector 323 is disposed upon the metal layer 310 after the photonics device 200 of FIG. 2, has undergone and passed testing, and is ready to be assembled with another component. One example of this is discussed below with respect to FIG. 5. The positioning of the reflector 323 will reduce any light signal loss in coupling light from the first light path 316, which may be similar to first light path 216, to and from the bidirectional optical grating coupler 304, which may be similar to bidirectional optical grating coupler 204 of FIG. 2. The bidirectional optical grating coupler 304 may be optically coupled with waveguide 306 and with the electro-optical circuitry 308, which may be similar to waveguide 206 and electro-optical circuitry 208 of FIG. 2, and may be found within optical layer 302, which may be similar to optical layer 202 of FIG. 2. The reflector 323 may be incorporated into the photonics device 300 package assembly stack and reflect the light back for optimum optical coupling efficiency. Without the reflector 323, the optical signal may be distorted or otherwise lost. With the reflector 323 the light is not lost or substantially attenuated within the optical device 300.

In embodiments, optical testing may occur prior to electrical bumps 313 being applied to the metal layer 310. In these embodiments, reflector 323 may be fabricated along with the electrical bumps 313 onto the metal layer 310. In this way, the reflector 323 may be implemented as a reflection layer on top of the metal layer 310 fabricated during substrate process flow on the metal layer 310. In embodiments, the surface of the reflector 323 should be smooth enough to reach the desired reflectivity attributes. In embodiments, the reflector 323 may be secured to the metal layer 310 using an epoxy (not shown). Any epoxy (not shown) used in the region of the reflector 323 should be selected with an optical index to avoid loss of the light reflecting back on the second path 317.

Figure 4:
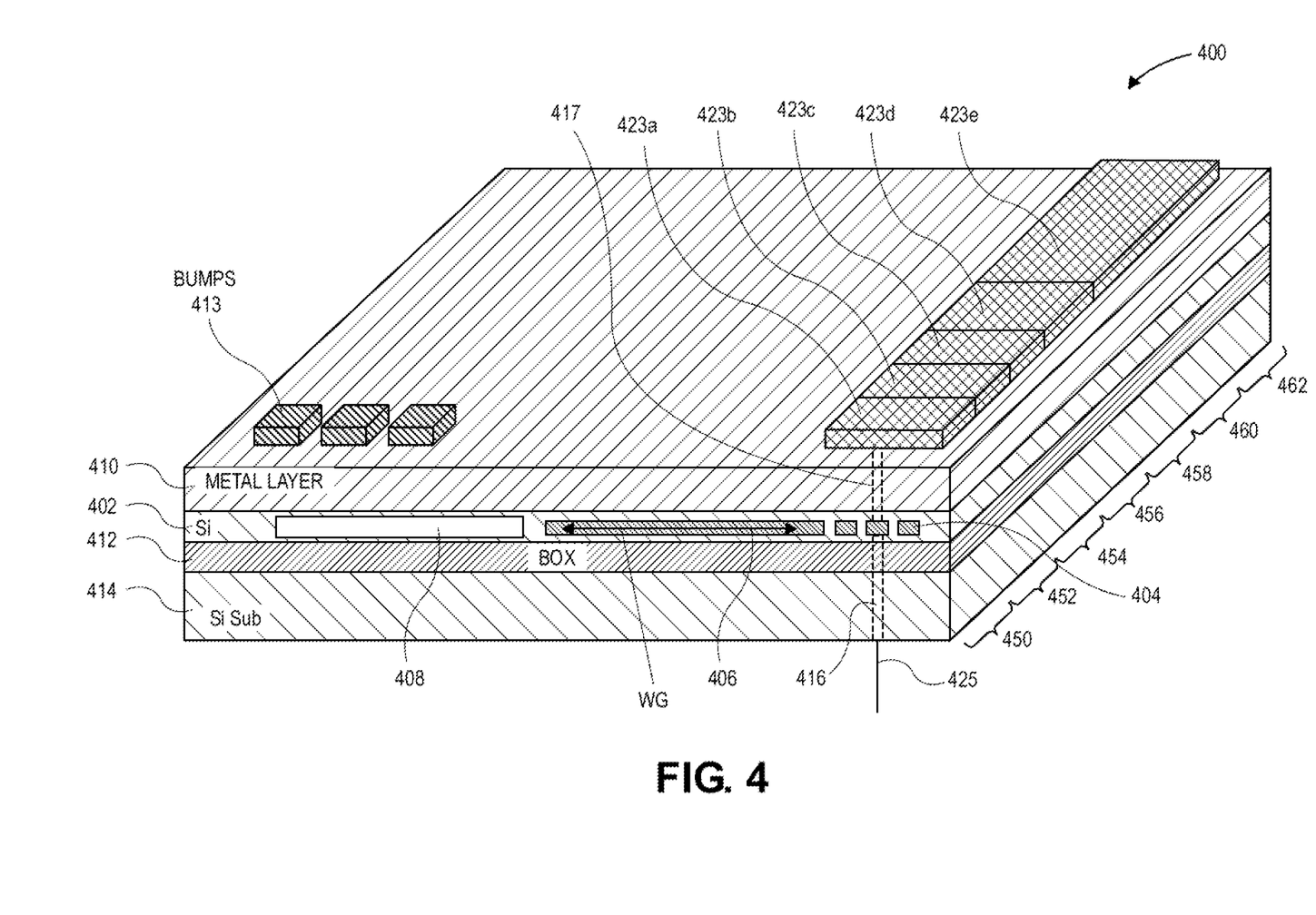
FIG. 4 illustrates photonics die with multiple optical circuitry each including an optical bidirectional optical grating coupler with a reflector on a layer of the photonics device, in accordance with embodiments.

FIG. 4 illustrates a photonics device with multiple optical circuitry each including an optical bidirectional optical grating coupler with a reflector on a layer of the photonics device, in accordance with embodiments. Photonics device 400 includes multiple photonics devices 450, 452, 454, 456, 458, 460, 462, each of which may be similar to photonics device 300 of FIG. 3. Photonics device 400 allows an array of first light paths 416, which may be similar to first light path 316 of FIG. 3, that pass through silicon substrate 414, and through a BOX layer 412, to be coupled with an array of optical fibers 425, and also coupled with an array of bidirectional optical grating couplers 404, which may be similar to bidirectional optical grating coupler 304 of FIG. 3, for optical signal transmission or reception.

Each of the multiple photonics devices 450, 452, 454, 456, 458, 460, 462 include a bidirectional optical grating coupler 404, similar to bidirectional optical grating coupler 304, of FIG. 3, that are optically coupled with an optical-electrical circuitry 408, similar to optical-electrical circuitry 208 of FIG. 2.

In embodiments, second optical paths 417, which may be similar to second optical path 317 of FIG. 3, are capped by reflectors 423a, 423b, 423c, 423d, that serve as individual reflectors, respectively, for photonics devices 450, 452, 454, 456. Reflector 423e may be a reflector layer that serves as a reflector for photonics devices 458, 460, 462. In this way, a block of photonic devices may be combined into a single device to allow multiple fibers 425 to connect to the device 400.

Prior to the application of the reflectors 423a, 423b, 423c, 423d, 423e to the metal layer 410, the photonics device 400 may go through a testing process by which light is sent down the second light path 417, through the bidirectional optical grating coupler 404, and into the optical-electrical circuitry 408 for testing. Once this testing is complete, the reflectors 423a, 423b, 423c, 423d, 423e may be applied to the surface of the metal layer 410. In embodiments, at that time electrical bumps 413 may also be applied to the metal layer 410 prior to implementing a flip chip process. In embodiments, the reflectors 423a, 423b, 423c, 423d, 423e may include a coating material that has good reflection of light in a wavelength range. In embodiments, they may include a material that has a bigger refractive index than the passivation layer below it, hence a total reflection may occur.

Figure 5:
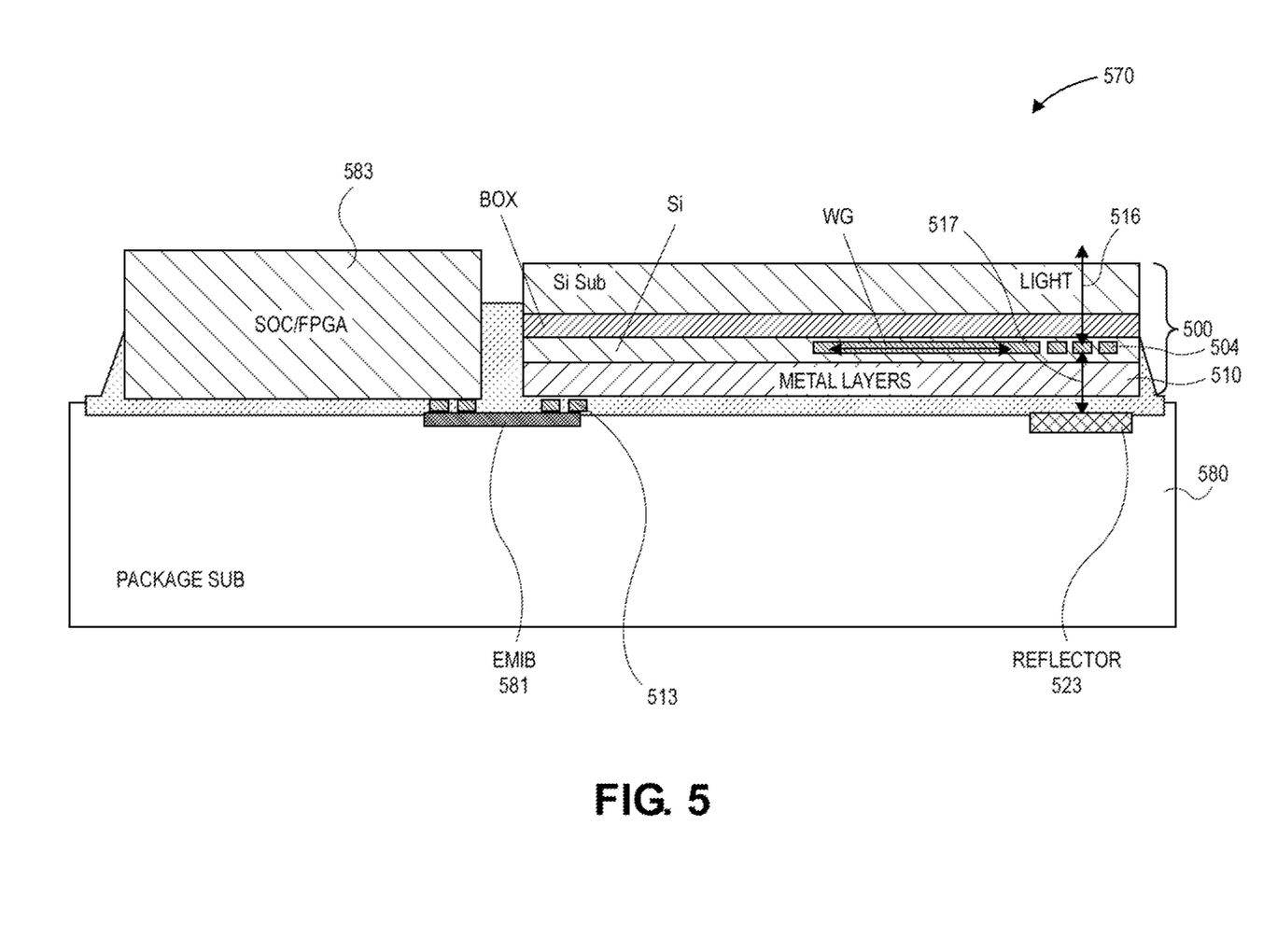
FIG. 5 illustrates an example cross-section of an optical multichip package (MCP) with optical transceiver tiles connected via an embedded multi-die interconnect Bridge (EMIB) with a reflector layer, in accordance with embodiments.

FIG. 5 illustrates an example cross-section of an optical multichip package (MCP) with optical transceiver tiles connected via an embedded multi-die interconnect Bridge (EMIB) with a reflector layer, in accordance with embodiments. Package 570 shows photonics package 500, which may be similar to photonics package 200 of FIG. 2. The photonics package 500 has been coupled to a package substrate 580. In embodiments, this coupling may have been achieved through a flip chip process. The reflector 523, which may be similar to reflector 323 of FIG. 3, is embedded into the package substrate 580 prior to the package 500 being applied. In embodiments, the reflector 523 may be fabricated during substrate manufacturing process; it may include a reflective metal layer or a higher refractive index material to create a full reflection on the reflector 523 interface. The smoothness of the surface layer may be critical to minimize the reflection loss. The epoxy materials used between the reflector and the silicon needs to have refractive index within a range to avoid interface losses. As shown, the reflector 523 will reflect light the second optical path 517, which may be similar to the second optical path 317 of FIG. 3, back toward the optical coupler 504, which may be similar to optical coupler 304 of FIG. 3.

As a result of the flip chip process, electrical connectors 513, which may be similar to electrical connectors 213 of FIG. 2, are available to electrically couple with a EMIB 581. In embodiments, the EMIB 581 may be available to couple with another device (not shown), which may also be coupled with another device 583. In embodiments, the device 583 may be a system-on-a-chip (SOC), a field programmable gate array (FPGA), or some other active and/or passive device to be included in package 570. In embodiments, there may be multiple devices 583 that may couple with one or more EMIBs 581 to be included in package 570.

As is known in the art, other types of interconnect technologies exist for the electrical interconnect of chiplets within a package. Embodiments described herein are in respect to an EMIB package construction. Other embodiments may include an open channel bridge (OCB), or a silicon interposer, organic routing on substrate 580 or a redistribution layer (RDL) on substrate 580, or some other electrical coupling. In embodiments, the electrical coupling may be a high density electrical coupling.

Due to the reflector 523 reflecting light received either from the first light path 516, or the bidirectional optical grating coupler 504, which may be similar, respectively, to first light path 316 and bidirectional optical grating coupler 310 of FIG. 3, this will allow the bidirectional optical grating coupler 504 to perform at a higher level of efficiency due to minimizing loss of light traveling down the second optical path 517. In addition, reflector 523 fabrication may also be incorporated into the substrate 580 manufacturing process, at little to no extra cost.

Figure 6:
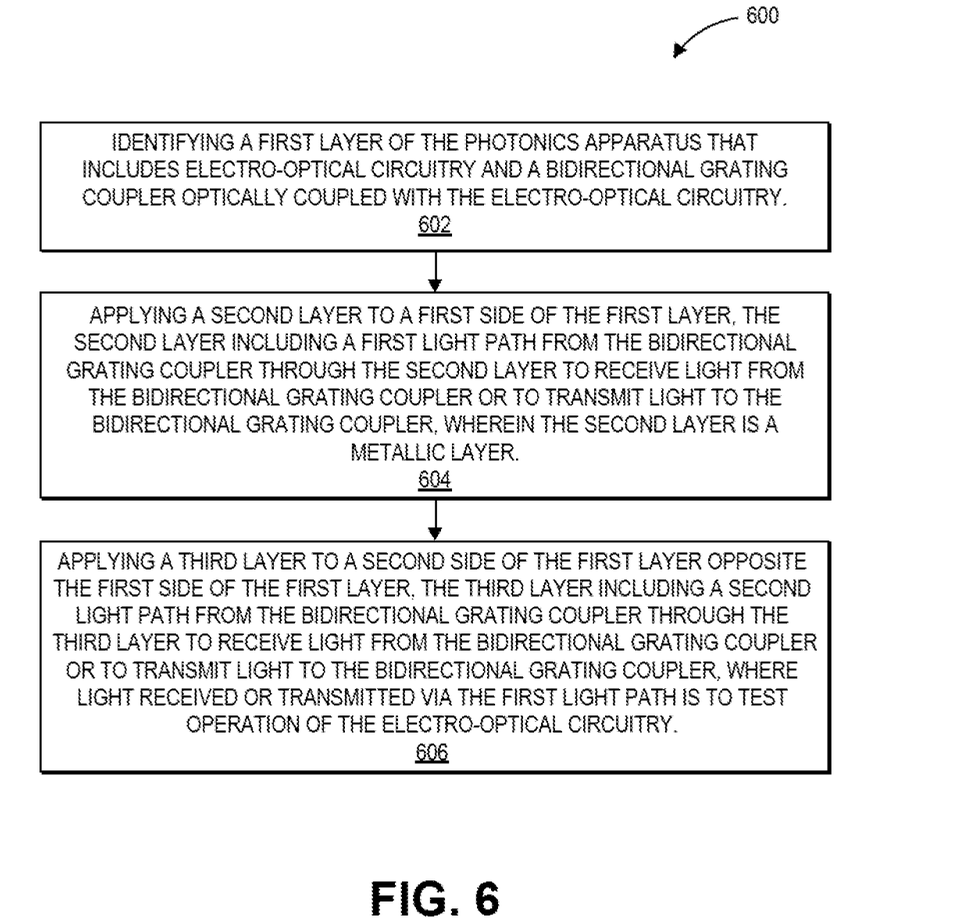
FIG. 6 is an example process for wafer level testing of an optical die prior to integration of a photonics device in an MCP, in accordance with embodiments.

FIG. 6 is an example process for wafer level testing of an optical die prior to integration of a photonics apparatus in an MCP, in accordance with embodiments. In embodiments, process 600 may be implemented using the techniques, processes, systems, and/or apparatuses as described herein, and particularly with respect to FIGS. 1-5.

At block 602, the process may include identifying a first layer of a photonics apparatus that includes optical or electro-optical circuitry and a bidirectional optical grating coupler optically coupled with the optical or electro-optical circuitry. In embodiments, this first layer may correspond to optical layer 202 of FIG. 2, that includes optical or electro-optical circuitry 208, coupled to a waveguide 206, that in turn is coupled to a bidirectional optical grating coupler 204.

At block 604, the process may include applying a second layer to a first side of the first layer, the second layer including a first light path from the bidirectional optical grating coupler through the second layer to receive light from the bidirectional optical grating coupler or to transmit light to the bidirectional optical grating coupler, wherein the second layer is a metallic layer. In embodiments, the second layer may correspond to silicon substrate 214 of FIG. 2, that includes a first light path 216 that couples with the bidirectional optical grating coupler 204. In embodiments, the second layer may include the BOX 212 layer of FIG. 2. In embodiments, the first light path 216 may be empty space, or may include a waveguide (not shown).

At block 606, the process may include applying a third layer to a second side of the first layer opposite the first side of the first layer, the third layer including a second light path from the bidirectional optical grating coupler through the third layer to receive light from the bidirectional optical grating coupler or to transmit light to the bidirectional optical grating coupler, where light received or transmitted via the first light path is to test operation of the electro-optical circuitry. In embodiments, the third layer may be a metal layer, similar to metal layer 210 of FIG. 2 applied to optical layer 202 opposite the silicon substrate 214. In embodiments, the second light path 217 may be empty space, or may include a waveguide (not shown). In embodiments, the first light path 216 and the second light path 217 may be in alignment such that a portion of light directed into first path 216 may exit the second light path 217.

In embodiments, subsequent to block 606, the process may further include applying a reflector to a first surface of the second layer opposite a second surface of the second layer that is physically coupled with the first side of the first layer, wherein the reflector is to reflect light back into the first light path, wherein the light is from the bidirectional optical grating coupler or from the second light path. In embodiments, block 606 may be performed after electro-optical circuitry, for example electro-optical circuitry 208 of FIG. 2, has been tested and has passed quality assurance requirements.

It should be appreciated that the first and second layers can be instantiated more than once within package construct.

Figure 7:
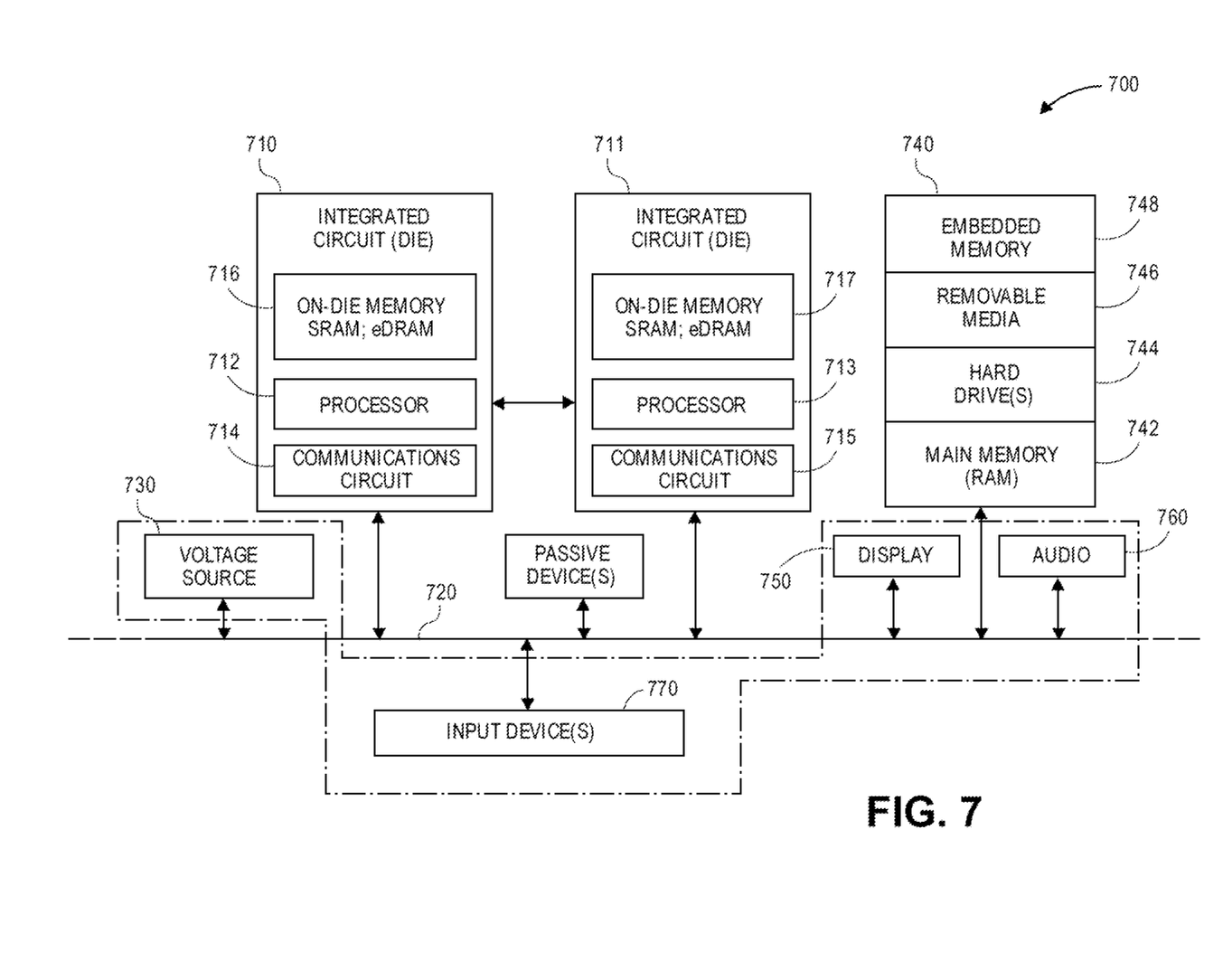
FIG. 7 schematically illustrates a computing device, in accordance with embodiments.

FIG. 7 schematically illustrates a computing device, in accordance with embodiments. The computer system 700 (also referred to as the electronic system 700) as depicted can embody all or part of bidirectional optical grating coupler with multiple light paths, according to any of the several disclosed embodiments and their equivalents as set forth in this disclosure. The computer system 700 may be a mobile device such as a netbook computer. The computer system 700 may be a mobile device such as a wireless smart phone. The computer system 700 may be a desktop computer. The computer system 700 may be a hand-held reader. The computer system 700 may be a server system. The computer system 700 may be a supercomputer or high-performance computing system.

In an embodiment, the electronic system 700 is a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

The integrated circuit 710 is electrically coupled to the system bus 720 and includes any circuit, or combination of circuits according to an embodiment. In an embodiment, the integrated circuit 710 includes a processor 712 that can be of any type. As used herein, the processor 712 may mean any type of circuit such as, but not limited to, a microprocessor, a microcontroller, a graphics processor, a digital signal processor, or another processor. In an embodiment, the processor 712 includes, or is coupled with, all or part of a bidirectional optical grating coupler with multiple light paths, as disclosed herein. In an embodiment, SRAM embodiments are found in memory caches of the processor. Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems, or a communications circuit for servers. In an embodiment, the integrated circuit 710 includes on-die memory 716 such as static random-access memory (SRAM). In an embodiment, the integrated circuit 710 includes embedded on-die memory 716 such as embedded dynamic random-access memory (eDRAM).

In an embodiment, the integrated circuit 710 is complemented with a subsequent integrated circuit 711. Useful embodiments include a dual processor 713 and a dual communications circuit 715 and dual on-die memory 717 such as SRAM. In an embodiment, the dual integrated circuit 710 includes embedded on-die memory 717 such as eDRAM.

In an embodiment, the electronic system 700 also includes an external memory 740 that in turn may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory drives, and other removable media known in the art. The external memory 740 may also be embedded memory 748 such as the first die in a die stack, according to an embodiment.

In an embodiment, the electronic system 700 also includes a display device 750, an audio output 760. In an embodiment, the electronic system 700 includes an input device such as a controller 770 that may be a keyboard, mouse, trackball, game controller, microphone, voice-recognition device, or any other input device that inputs information into the electronic system 700. In an embodiment, an input device 770 is a camera. In an embodiment, an input device 770 is a digital sound recorder. In an embodiment, an input device 770 is a camera and a digital sound recorder.

As shown herein, the integrated circuit 710 can be implemented in a number of different embodiments, including all or part of bidirectional optical grating couplers with multiple light paths, according to any of the several disclosed embodiments and their equivalents, an electronic system, a computer system, one or more methods of fabricating an integrated circuit, and one or more methods of fabricating an electronic assembly that includes a package substrate implementing all or part of a bidirectional optical grating coupler with multiple light paths, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed processes used for a bidirectional optical grating coupler with multiple light paths. A foundation substrate may be included, as represented by the dashed line of FIG. 7. Passive devices may also be included, as is also depicted in FIG. 7.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

Embodiments described herein may be with reference to one or more photonics chiplets that have both electro-optical and optical circuit topologies. Embodiments may equally apply to chiplets with exclusively optical only circuits within the optical package or within the chiplet. Functions, such as optical filters or optical shuffles may be examples of chiplets with no electrical circuits.

Embodiments described herein describe one bidirectional grating coupler embodiment within a package. Embodiments may include a plurality of bidirectional grating couplers on one or more chiplets within an optical package.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a photonics package comprising: a first layer that includes: electro-optical circuitry; and a bidirectional optical grating coupler optically coupled with the electro-optical circuitry; a second layer physically coupled with a first side of the first layer, the second layer including a first light path from the bidirectional optical grating coupler through the second layer, the bidirectional optical grating coupler to receive light or to transmit light via the first light path; a third layer physically coupled with a second side of the first layer opposite the first side of the first layer, the third layer including a second light path from the bidirectional optical grating coupler through the third layer, the bidirectional optical grating coupler to receive light or to transmit light via the second light path; and wherein operational testing of the first layer is based in part on light received or transmitted through the first light path.

Example 2 may include the photonics package of example 1, wherein the second layer is a metal layer electrically coupled with the electro-optical circuitry, or wherein the electro-optical circuitry is electrical circuitry or optical circuitry.

Example 3 may include the photonics package of example 1, further including a reflector optically coupled with the first light path to reflect light back into the first light path and toward the bidirectional optical grating coupler.

Example 4 may include the photonics package of example 3, wherein the reflector is physically coupled with the second layer.

Example 5 may include the photonics package of example 3, wherein the reflector is disposed on a first surface of the second layer opposite a second surface of the second layer that is physically coupled with the first side of the first layer.

Example 6 may include the photonics package of example 5, further comprising a substrate coupled with the first surface of the second layer.

Example 7 may include the photonics package of example 6, further comprising electrical contacts on the first surface of the second layer.

Example 8 may include the photonics package of example 6, wherein the first surface of the second layer is coupled with the substrate using flip chip.

Example 9 may include the photonics package of example 3, wherein the light reflected back into the first light path entered the first light path via the bidirectional optical grating coupler or via the second light path.

Example 10 may include the photonics package of example 1, wherein the first light path and the second light path are along a same line.

Example 11 may include the photonics package of example 1, further comprising a waveguide optically coupling the bidirectional optical grating coupler with the electoral-optical circuitry.

Example 12 may include the photonics package of any one of examples 1-11, wherein the second layer is a buried oxide (BOX) layer or a silicon layer.

Example 13 is a method for testing a photonics apparatus, the method comprising: identifying a first layer of the photonics apparatus that includes electro-optical circuitry and a bidirectional optical grating coupler optically coupled with the electro-optical circuitry; applying a second layer to a first side of the first layer, the second layer including a first light path from the bidirectional optical grating coupler through the second layer to receive light from the bidirectional optical grating coupler or to transmit light to the bidirectional optical grating coupler, wherein the second layer is a metallic layer; applying a third layer to a second side of the first layer opposite the first side of the first layer, the third layer including a second light path from the bidirectional optical grating coupler through the third layer to receive light from the bidirectional optical grating coupler or to transmit light to the bidirectional optical grating coupler; and wherein light received or transmitted via the first light path is to test operation of the electro-optical circuitry.

Example 14 may include the method of example 13, further comprising testing the operation of the electro-optical circuitry via the first light path.

Example 15 may include the method of example 14, further comprising applying a reflector to a first surface of the second layer opposite a second surface of the second layer that is physically coupled with the first side of the first layer, wherein the reflector is to reflect light back into the first light path, wherein the light is from the bidirectional optical grating coupler or from the second light path.

Example 16 may include the method of example 15, further comprising applying electrical contacts on the first surface of the second layer that are electrically coupled with the electro-optical circuitry.

Example 17 may include the method of any one of examples 13-16, further comprising applying the first surface of the second layer to a package substrate.

Example 18 may be a system, comprising: a photonics package including: a first layer that includes: electro-optical circuitry; and a bidirectional optical grating coupler optically coupled with the electro-optical circuitry; a second layer having a first side and a second side opposite the first side, the first side physically coupled with a first side of the first layer, the second layer including: a first light path extending from the bidirectional optical grating coupler through the first side of the second layer to a reflector physically coupled with the second layer, the reflector to reflect light back into the first light path; one or more electrical connectors coupled with the second side of the second layer that are electrically coupled with the electro-optical circuitry; and a third layer physically coupled with a second side of the first layer opposite the first side of the first layer, the third layer including a second light path from the bidirectional optical grating coupler through the third layer, the bidirectional optical grating coupler to receive light or to transmit light via the second light path; and an embedded multi-die interconnect bridge (EMIB) electrically coupled to the one or more electrical connectors.

Example 19 may include the system of example 18, further comprising a substrate coupled with second side of the second layer; and wherein the EMIB is recessed into the substrate.

Example 20 may include the system of any one of examples 18-19, wherein the third layer is a buried oxide (BOX) layer or a silicon layer.

Example 21 is a photonics package comprising: at least one first layer that includes: elemental circuitry of at least one of either electrical, optical or electro-optical or combinations thereof; and at least one bidirectional optical grating coupler optically coupled with at least one circuitry element; an at least one second layer physically coupled with a first side of the at least one first layer, the at least one second layer including a first light path from the at least one bidirectional optical grating coupler through the at least one second layer, the at least one bidirectional optical grating coupler to receive light and/or to transmit light via the first light path; an at least one third layer physically coupled with a second side of the at least one first layer opposite the at least one first side of the at least one first layer, the at least one third layer including a second light path from the at least one bidirectional optical grating coupler through the at least one third layer, the at least one bidirectional optical grating coupler to receive light and/or to transmit light via the second light path; and wherein operational testing of the at least one first layers prior to assembly of said package of the at least one element of circuitry is based in part on light received and/or transmitted through the first light path.

What is claimed is:

1. A photonics package comprising:
    a first layer that includes:
        electro-optical circuitry; and
        a bidirectional optical grating coupler optically coupled with the electro-optical circuitry;
    a second layer physically coupled with a first side of the first layer, the second layer including a first light path from the bidirectional optical grating coupler through the second layer, the bidirectional optical grating coupler to receive light or to transmit light via the first light path;
    a third layer physically coupled with a second side of the first layer opposite the first side of the first layer, the third layer including a second light path from the bidirectional optical grating coupler through the third layer, the bidirectional optical grating coupler to receive light or to transmit light via the second light path;
    wherein operational testing of the first layer is based in part on light received or transmitted through the first light path; and
    a reflector optically coupled with the first light path to reflect light back into the first light path and toward the bidirectional optical grating coupler, wherein the reflector is on a same side of the optical grating coupler as the second layer.

2. The photonics package of claim 1, wherein the second layer is a metal layer electrically coupled with the electro-optical circuitry, or wherein the electro-optical circuitry is electrical circuitry or optical circuitry.

3. The photonics package of claim 1, wherein the reflector is physically coupled with the second layer.

4. The photonics package of claim 1, wherein the reflector is disposed on a first surface of the second layer opposite a second surface of the second layer that is physically coupled with the first side of the first layer.

5. The photonics package of claim 3, further comprising a substrate coupled with the first surface of the second layer.

6. The photonics package of claim 5, further comprising electrical contacts on the first surface of the second layer.

7. The photonics package of claim 5, wherein the first surface of the second layer is coupled with the substrate using flip chip.

8. The photonics package of claim 1, wherein the light reflected back into the first light path entered the first light path via the bidirectional optical grating coupler or via the second light path.

9. The photonics package of claim 1, wherein the first light path and the second light path are along a same line.

10. The photonics package of claim 1, further comprising a waveguide optically coupling the bidirectional optical grating coupler with the electoral-optical circuitry.

11. The photonics package of claim 1, wherein the second layer is a buried oxide (BOX) layer or a silicon layer.

12. A method for testing a photonics apparatus, the method comprising:
    identifying a first layer of the photonics apparatus that includes electro-optical circuitry and a bidirectional optical grating coupler optically coupled with the electro-optical circuitry;
    applying a second layer to a first side of the first layer, the second layer including a first light path from the bidirectional optical grating coupler through the second layer to receive light from the bidirectional optical grating coupler or to transmit light to the bidirectional optical grating coupler, wherein the second layer is a metallic layer;
    applying a third layer to a second side of the first layer opposite the first side of the first layer, the third layer including a second light path from the bidirectional optical grating coupler through the third layer to receive light from the bidirectional optical grating coupler or to transmit light to the bidirectional optical grating coupler;
    wherein light received or transmitted via the first light path is to test operation of the electro-optical circuitry;
    testing the operation of the electro-optical circuitry via the first light path; and
    applying a reflector to a first surface of the second layer opposite a second surface of the second layer that is physically coupled with the first side of the first layer, wherein the reflector is to reflect light back into the first light path, wherein the light is from the bidirectional optical grating coupler or from the second light path.

13. The method of claim 12, further comprising applying electrical contacts on the first surface of the second layer that are electrically coupled with the electro-optical circuitry.

14. The method of claim 13, further comprising applying the first surface of the second layer to a package substrate.

15. A system, comprising:
    a photonics package including:
        a first layer that includes:
            electro-optical circuitry; and
            a bidirectional optical grating coupler optically coupled with the electro-optical circuitry;
        a second layer having a first side and a second side opposite the first side, the first side physically coupled with a first side of the first layer, the second layer including:
            a first light path extending from the bidirectional optical grating coupler through the first side of the second layer to a reflector physically coupled with the second layer, the reflector to reflect light back into the first light path;
            one or more electrical connectors coupled with the second side of the second layer that are electrically coupled with the electro-optical circuitry; and
        a third layer physically coupled with a second side of the first layer opposite the first side of the first layer, the third layer including a second light path from the bidirectional optical grating coupler through the third layer, the bidirectional optical grating coupler to receive light or to transmit light via the second light path; and
        a reflector optically coupled with the first light path to reflect light back into the first light path and toward the bidirectional optical grating coupler, wherein the reflector is on a same side of the optical grating coupler as the second layer; and
    an embedded multi-die interconnect bridge (EMIB) electrically coupled to the one or more electrical connectors.

16. The system of claim 15, further comprising a substrate coupled with second side of the second layer; and wherein the EMIB is recessed into the substrate.

17. The system of claim 15, wherein the third layer is a buried oxide (BOX) layer or a silicon layer.

* * * * *